United States Patent
Uesaka

(10) Patent No.: US 10,586,778 B2
(45) Date of Patent: Mar. 10, 2020

(54) ELASTIC WAVE ELEMENT AND ELASTIC WAVE APPARATUS

(71) Applicant: Murata Manufacturing Co., Ltd., Nagaokakyo-shi, Kyoto-fu (JP)

(72) Inventor: Kenichi Uesaka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 38 days.

(21) Appl. No.: 16/150,354

(22) Filed: Oct. 3, 2018

(65) Prior Publication Data
US 2019/0035754 A1   Jan. 31, 2019

Related U.S. Application Data

(63) Continuation of application No. PCT/JP2017/014816, filed on Apr. 11, 2017.

(30) Foreign Application Priority Data

Apr. 11, 2016  (JP) ................... 2016-079138

(51) Int. Cl.
*H01L 23/48* (2006.01)
*H01L 23/52* (2006.01)
(Continued)

(52) U.S. Cl.
CPC .............. *H01L 24/14* (2013.01); *H01L 23/28* (2013.01); *H01L 23/49811* (2013.01);
(Continued)

(58) Field of Classification Search
CPC ....... H01L 41/18; H01L 41/277; H01L 41/29; H01L 2021/60022; H01L 21/563;
(Continued)

(56) References Cited

U.S. PATENT DOCUMENTS 5,801,447 A  9/1998 Hirano et al.
6,590,293 B2 * 7/2003 Onishi ................. H01L 23/315
257/737
(Continued)

FOREIGN PATENT DOCUMENTS

JP  08-298269 A  11/1996
JP  2001-068594 A   3/2001
(Continued)

OTHER PUBLICATIONS

Official Communication issued in International Patent Application No. PCT/JP2017/014816, dated Jun. 6, 2017.

*Primary Examiner* — S. V. Clark
(74) *Attorney, Agent, or Firm* — Keating & Bennett, LLP

(57) ABSTRACT

An elastic wave element includes a vibrator, an electrode pad, a UBM portion including a first end surface joined to the electrode pad, and a bump joined to a second end surface of the UBM portion. Joint terminals are defined by joining the electrode pad, the UBM portion, and the bump. A shortest distance between a specified joint terminal and remaining joint terminals is an inter-bump distance of the specified joint terminal. Second end surfaces of first and second joint terminal have areas greater than areas of second end surfaces of remaining joint terminals. The inter-bump distance of the first joint terminal is longer than the shortest inter-bump distance of the joint terminals and is the longest of the inter-bump distances. The second joint terminal is spaced the longest inter-bump distance from the first joint terminal.

18 Claims, 10 Drawing Sheets

(51) Int. Cl.
   *H01L 29/40*    (2006.01)
   *H01L 23/00*    (2006.01)
   *H03H 9/10*     (2006.01)
   *H03H 9/05*     (2006.01)
   *H03H 9/25*     (2006.01)
   *H01L 23/28*    (2006.01)
   *H01L 23/498*   (2006.01)
   *H01L 23/538*   (2006.01)
   *H01L 41/09*    (2006.01)
   *H01L 41/25*    (2013.01)

(52) U.S. Cl.
   CPC ........ *H01L 23/5384* (2013.01); *H01L 23/562* (2013.01); *H01L 24/95* (2013.01); *H01L 41/09* (2013.01); *H01L 41/25* (2013.01); *H03H 9/059* (2013.01); *H03H 9/1071* (2013.01); *H03H 9/1085* (2013.01); *H03H 9/25* (2013.01); *H01L 23/49816* (2013.01)

(58) Field of Classification Search
   CPC ......... H01L 2224/1703; H01L 23/3128; H01L 41/04; H01L 41/0472; H01L 41/0805; H01L 41/297; H01L 41/31
   USPC ................................................ 257/780, 781
   See application file for complete search history.

(56) References Cited

U.S. PATENT DOCUMENTS

| | | | |
|---|---|---|---|
| 6,774,490 B2 * | 8/2004 | Soga | B23K 35/262 |
| | | | 257/772 |
| 2008/0185735 A1 | 8/2008 | Pham et al. | |
| 2010/0289600 A1 | 11/2010 | Takada et al. | |
| 2017/0214386 A1 * | 7/2017 | Kido | H03H 9/25 |
| 2019/0036510 A1 * | 1/2019 | Kikuchi | H01L 23/04 |
| 2019/0181828 A1 * | 6/2019 | Iwamoto | H01L 41/053 |
| 2019/0222194 A1 * | 7/2019 | Nakagawa | H03H 9/1085 |
| 2019/0305748 A1 * | 10/2019 | Yamane | H03H 9/1092 |

FOREIGN PATENT DOCUMENTS

| | | |
|---|---|---|
| JP | 2014-082526 A | 5/2014 |
| WO | 2009/104438 A1 | 8/2009 |

* cited by examiner

ELASTIC WAVE ELEMENT AND ELASTIC WAVE APPARATUS

CROSS REFERENCE TO RELATED APPLICATIONS

This application claims the benefit of priority to Japanese Patent Application No. 2016-079138 filed on Apr. 11, 2016 and is a Continuation Application of PCT Application No. PCT/JP2017/014816 filed on Apr. 11, 2017. The entire contents of each application are hereby incorporated herein by reference.

BACKGROUND OF THE INVENTION

1. Field of the Invention

The present invention relates to an elastic wave element and an elastic wave apparatus.

2. Description of the Related Art

Flip-chip mounting is an example of a method for mounting an electronic device in a small size and low profile. International Publication No. 2009/104438, for example, discloses an elastic wave device having a wafer level package (WLP) structure including a substrate, a vibrator disposed on the substrate, pads connected to the vibrator and disposed on the substrate, a support layer standing erect around the vibrator, a cover layer covering the vibrator, via conductors joined to the pads, and bumps connected to the via conductors. The elastic wave device having this structure prevents, when mounted on the mount board by being sealed with resin, resin and flux from flowing into the hollow space in which the vibrator is disposed, and secures high fluid tightness of the hollow space.

An elastic wave device mounted on a mount board using bumps, as disclosed in International Publication No. 2009/104438, usually has the bumps arrayed in a symmetrical layout when the substrate is viewed in a plan, to equalize stress imposed on the bump joints due to the temperature change during mounting of the device on the mount board and use of the device. The elastic wave device having this structure can thus improve mechanical reliability.

However, a reduction of the pitch of the bumps, while retaining the symmetry of the bump layout, to satisfy the demand for size reduction of the elastic wave apparatus hinders resin introduction into the space between the elastic wave device and the mount board, and degrades the reliability in airtightness, heat resistance, moisture tightness, and insulating properties of the elastic wave device.

SUMMARY OF THE INVENTION

Preferred embodiments of the present invention provide elastic wave elements and elastic wave apparatuses in each of which the elastic wave element is mounted on a mount board by being sealed with resin introduced more efficiently and the elastic wave elements each include bump joints having improved mechanical reliability.

An elastic wave element according to a preferred embodiment of the present invention includes a substrate including a first main surface and a second main surface, which face away from each other; an elastic wave exciting portion disposed on the substrate and exciting elastic waves; an electrode pad disposed on the first main surface and connected to the elastic wave exciting portion; an intermediate electrode including a first end surface and a second end surface, which face away from each other, the first end surface being joined to the electrode pad; and a bump joined to the second end surface of the intermediate electrode. Three or more joint terminals are disposed on the first main surface, each of the joint terminals being defined by sequentially joining the electrode pad, the intermediate electrode, and the bump. When the first main surface is viewed in a plan, a shortest distance between a specified one of the joint terminals and the other joint terminals around the specified joint terminal is determined as an inter-bump distance of the specified joint terminal. The second end surface of at least one of a first joint terminal and a second joint terminal has an area greater than areas of the second end surfaces of a remaining joint terminal or remaining joint terminals. The inter-bump distance of the first joint terminal is longer than a shortest one of the inter-bump distances determined for the respective joint terminals and is the longest one of the inter-bump distances. The second joint terminal is spaced the longest inter-bump distance apart from the first joint terminal.

When the elastic wave element having the structure according to the background art is flip-chip mounted on the mount board, resin introduction into the space between the mount board the elastic wave element is improved with the number of joint terminals being reduced from the number of the joint terminals in a symmetrical layout to increase the distance between the joint terminals. Reduction of the number of joint terminals and an asymmetrical layout of the joint terminals produce uneven stress on the joint terminals. Thus, cracks are more likely to occur near the second end surfaces of the first and second joint terminals.

In the structure according to the above-described preferred embodiment, on the other hand, the inter-bump distance between the first and second joint terminals is longer than the other inter-bump distance/distances, which facilitates resin introduction. In addition, the area of the second end surface of at least one of the first and second joint terminals is greater than the areas of the second end surfaces of a remaining joint terminal or remaining joint terminals. This structure reduces stress on the at least one joint terminal, and thus reduces the unevenness of stress on the joint terminals and prevents cracks that may occur near the second end surfaces of the joint terminals. Specifically, this structure facilitates resin introduction during sealing of the elastic wave element with resin and improves the mechanical reliability of the joint terminals.

The second end surface of a third joint terminal located second closest to the first joint terminal after the second joint terminal may have an area greater than the areas of the second end surfaces of a remaining joint terminal or remaining joint terminals.

This structure reduces, besides the stress imposed on the first and second joint terminals in the direction connecting the first and second joint terminals, the stress imposed on the first and second joint terminals in a direction different from the above direction. Thus, this structure further prevents cracks from occurring near the second end surfaces of the first and second joint terminals.

The area of the second end surface of either one of the first and second joint terminals may be greater than the areas of the second end surfaces of a remaining joint terminal or remaining joint terminals.

Enlarging the area of the second end surface of each joint terminal reduces the gap between the joint terminals, and restricts the area of the elastic wave exciting portion disposed between the joint terminals. With this point taken into consideration, enlarging the area of the second end surface of either one of the first and second joint terminals further reduces the restriction on the layout of the elastic wave exciting portion disposed on the substrate while achieving facilitation of resin introduction during sealing of the elastic wave element with resin and preventing cracks from occurring in the joint terminals, compared to enlarging the areas of the second end surfaces of both the first and second joint terminals.

When the first main surface is viewed in plan view, the substrate may be rectangular, and the area of the second end surface of either one of the first and second joint terminals located closer to any of four corners of the substrate may be greater than the areas of the second end surfaces of a remaining joint terminal or remaining joint terminals.

Reduction of the number of joint terminals and an asymmetrical layout of the joint terminals are more likely to allow a larger stress to be exerted on either one of the first and second joint terminals located closer to one of the four corners of the substrate. Thus, cracks may occur near the second end surface of the joint terminal. With this point taken into consideration, enlarging the area of the second end surface of either one of the first and second joint terminals located closer to one of the four corners of the substrate further reduces the restriction on the layout of the elastic wave exciting portion and the wirings disposed on the substrate, while achieving facilitation of resin introduction during sealing of the elastic wave element with resin and preventing cracks from occurring in the joint terminals.

A plurality of at least one of the first and second joint terminals may be provided.

This structure reduces the stress on at least one of the joint terminals, and thus reduces the unevenness of stress on the joint terminals and prevents cracks that may occur near the second end surfaces of the joint terminals.

An elastic wave apparatus according to a preferred embodiment of the present invention includes the above-described elastic wave element; a mount board to which the bump is joined and disposed opposite the elastic wave element; and a resin member in contact with the mount board so as to cover the elastic wave element. The substrate is a piezoelectric substrate. The elastic wave exciting portion is an IDT electrode disposed on the first main surface. The elastic wave element further includes a support layer on the first main surface around an area in which the IDT electrode is disposed, the support layer having a height from the first main surface greater than a height of the IDT electrode, and a cover layer disposed such that the support layer is between the cover layer and the first main surface and covering the IDT electrode. The intermediate electrode is disposed in contact with the support layer so as to extend through the cover layer. The substrate, the support layer, and the cover layer define an interior space in which the IDT electrode is disposed. The resin member is not disposed in the interior space, and is disposed in a space between the cover layer and the mount board and between a plurality of the bumps.

Thus, in an elastic wave apparatus having a structure in which a surface acoustic wave element having a wafer level package (WLP) structure is sealed with resin on the mount board, the inter-bump distance between the first and second joint terminals of the elastic wave element is greater than the other inter-bump distance/distances. This structure facilitates resin introduction into the space between the bumps. In addition, the area of the second end surface of at least one of the first and second joint terminals is greater than the areas of the second end surfaces of a remaining joint terminal or remaining joint terminals. This structure reduces stress of the at least one joint terminal, and thus reduces the unevenness of stress on the joint terminals and prevents cracks that may occur near the second end surfaces of the first and second joint terminals. Specifically, this structure facilitates resin introduction during sealing of the elastic wave element with resin and prevents cracks from occurring in the joint terminals.

Preferred embodiments of the present invention provide elastic wave elements and elastic wave apparatuses in each of which an elastic wave element according to a preferred embodiment of the present invention is mounted on a mount board by being sealed with resin introduced more efficiently and the elastic wave elements each include the bump joints having improved mechanical reliability.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
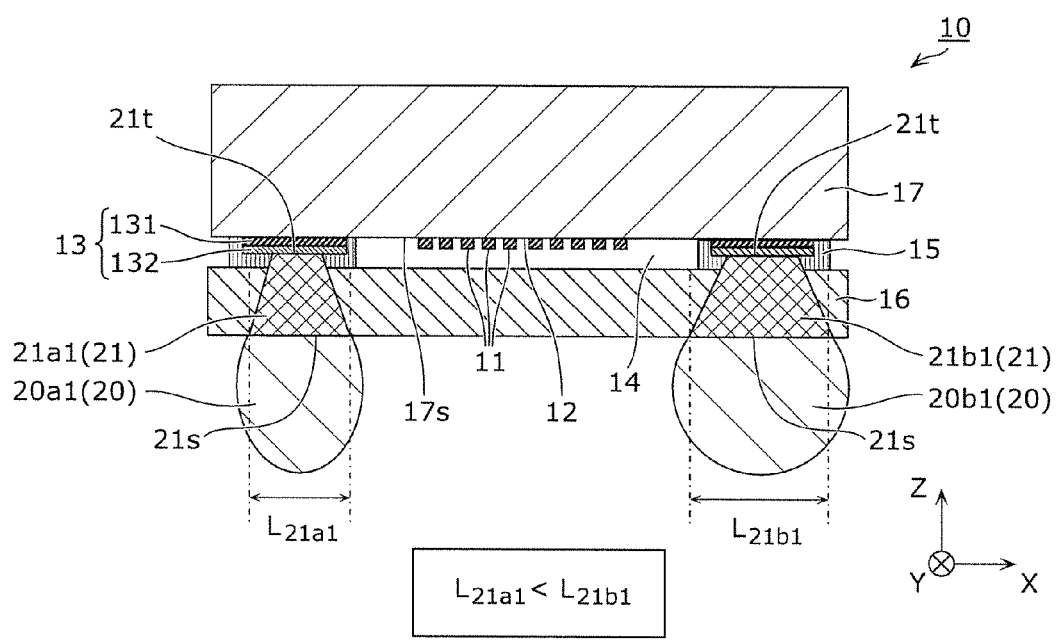
FIG. 1 is a sectional view of an elastic wave element according to a first preferred embodiment of the present invention.

Preferred embodiments of the present invention are described in detail with reference to the drawings. The preferred embodiments described below illustrate general or specific examples. The numerical values, shapes, materials, components, positions of the components, connection structures of the components, manufacturing processes, the order of the manufacturing processes, and other specific details described in each of the preferred embodiments below are mere examples and are not intended to limit scope of the present invention. Of components according to preferred embodiments described below, components not described in independent claims are described as optional components. The size or dimensional ratio of components illustrated in the drawings is not necessarily precise.

First Preferred Embodiment

FIG. 1 is a sectional view of an elastic wave element 10 according to a first preferred embodiment of the present invention. The elastic wave element 10 illustrated in FIG. 1 includes a piezoelectric substrate 17, a vibrator 12, electrode pads 13, a support layer 15, a cover layer 16, under-bump metal portions (hereinafter referred to as UBM portions) 21 (21a1 and 21b1), and bumps 20 (20a1 and 20b1). The elastic wave element 10 according to the present preferred embodiment has a wafer level package (WLP) structure including a piezoelectric substrate 17 having a function of propagating elastic waves and a packaging function to achieve a small size and low profile. The elastic wave element 10 having this structure is preferably used in, for example, a surface acoustic wave (SAW) filter that selectively allows high-frequency signals in a predetermined frequency band to pass therethrough.

The vibrator 12 is an elastic wave exciting portion that excites elastic waves, and includes an interdigital transducer (IDT) electrode 11 disposed on a surface 17s of the piezoelectric substrate 17. The IDT electrode 11 is a functional electrode that converts elastic waves propagated through the piezoelectric substrate 17 into electric signals or converts electric signals into the elastic waves.

Each of the electrode pads 13 is electrically connected to the IDT electrode 11, and disposed on the surface 17s of the piezoelectric substrate 17. Each electrode pad 13 retrieves electric signals converted by the IDT electrode 11 or feeds electric signals to the IDT electrode 11. Each electrode pad 13 is preferably, for example, a multilayer body including a terminal electrode 131 and a wire electrode 132. The terminal electrode 131 is connected to the IDT electrode 11 and disposed around the IDT electrode 11. The terminal electrode 131 is preferably made of a material the same as that for the IDT electrode 11. The wire electrode 132 is electrically connected to the terminal electrode 131 and defines a portion of a wiring path connecting the IDT electrode 11 to the wiring outside the elastic wave element 10. The terminal electrode 131 and the wire electrode 132 may preferably be defined by multiple multilayer bodies made of metal or an alloy, for example.

The piezoelectric substrate 17 is preferably, for example, a substrate made of a $LiNbO_3$ single crystal or a $LiTaO_3$ single crystal. The IDT electrode 11 is preferably, for example, a comb-shaped electrode mainly made of Cu, Al, Pt, a multilayer body made of Cu, Al, and Pt, or an alloy of any of Cu, Al, and Pt.

The support layer 15 is disposed around the IDT electrode 11.

The cover layer 16 is disposed on the support layer 15.

In the above structure, the piezoelectric substrate 17, the support layer 15, and the cover layer 16 enclose the IDT electrode 11 in a hollow space 14.

The support layer 15 is preferably made of a material including at least one of, for example, polyimide, epoxy, benzocyclobutene (BCB), polybenzoxazole (PBO), metal, and a silicon oxide.

The cover layer 16 is preferably made of a material including at least one of, for example, epoxy, polyurethane, phenol, polyester, BCB, and PBO. The cover layer 16 may include two layers. In this case, preferably, a first layer made of the above material underlies a second layer made of a material containing at least one of, for example, polyimide, epoxy, BCB, PBO, silicon, a silicon oxide, $LiTaO_3$, and $LiNbO_3$.

A via hole (through hole) extending to each electrode pad 13 disposed on the surface 17s of the piezoelectric substrate 17 is provided in the cover layer 16 and the support layer 15. Each via hole is filled with one of the UBM portions 21, defining and functioning as via conductors. Each of the UBM portions 21 includes a first end surface 21t and a second end surface 21s, which face away from each other. Each of the UBM portions 21 is an intermediate electrode including the first end surface 21t joined to the corresponding electrode pad 13 and the second end surface 21s joined to the corresponding bump 20. Each UBM portion 21 extends through the cover layer 16 and the support layer 15 to an upper portion of the piezoelectric substrate 17. A bump 20 is disposed on each UBM portion 21 and exposed to the outside. Examples of the UBM portions 21 include, for example, a Cu/Ni alloy and a Ni/Au alloy with which the via holes are filled by electrolytic plating. An Au film may be disposed on the surfaces of the UBM portions 21 to prevent oxidation.

The bumps 20 are joined to the second end surfaces 21s of the UBM portions 21 and protrude from the cover layer 16. The bumps 20 are preferably ball-shaped electrodes made of a highly conductive metal, for example, solder bumps made of Sn/Ag/Cu or bumps mainly made of Au.

The second end surface 21s of each UBM portion 21 to which the corresponding bump 20 is joined may be a flat surface or a curved surface, for example.

On the surface 17s of the piezoelectric substrate 17, three or more joint terminals are disposed. In each of the joint terminals, one of the electrode pads 13, the corresponding UBM portion 21, and the corresponding bump 20 are joined together in this order.

Figure 3:
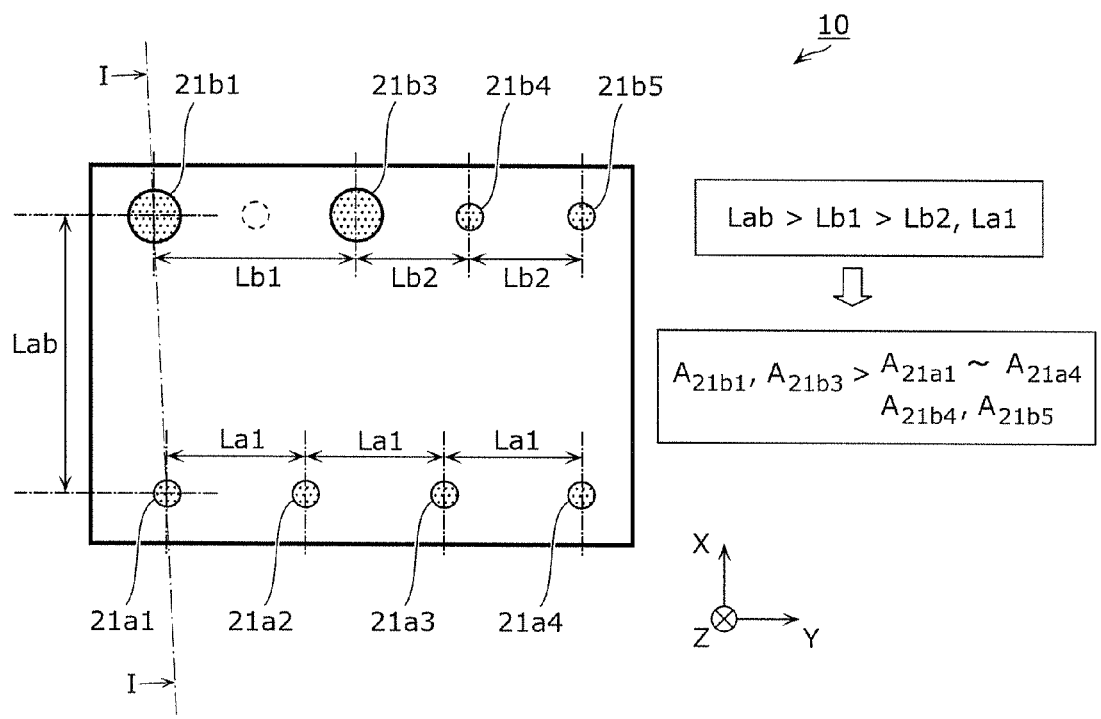
FIG. 3 is a plan view of a cover layer surface of the elastic wave element according to the first preferred embodiment of the present invention.

FIG. 1 illustrates only two joint terminals each including one electrode pad 13, the corresponding UBM portion 21, and the corresponding bump 20, arrayed in the X axis direction with the hollow space 14 interposed therebetween. Actually, however, the number of joint terminals is determined based on the number of I/O terminals and GND terminals of the elastic wave element 10 or the balance of the bonding strength with which the elastic wave element 10 is joined to the mount board (for example, eight joint terminals are included in the present preferred embodiment as illustrated in FIG. 3).

In the elastic wave element 10 according to the present preferred embodiment, the area of the second end surface 21s of the UBM portion 21b1 (length $L_{21b1}$ in FIG. 1) is greater than the area of the second end surface 21s of the UBM portion 21a1 (length $L_{21a1}$ in FIG. 1).

Subsequently, the structure of an elastic wave apparatus 1 in which the above-described elastic wave element 10 is mounted on the mount board is described.

Figure 2:
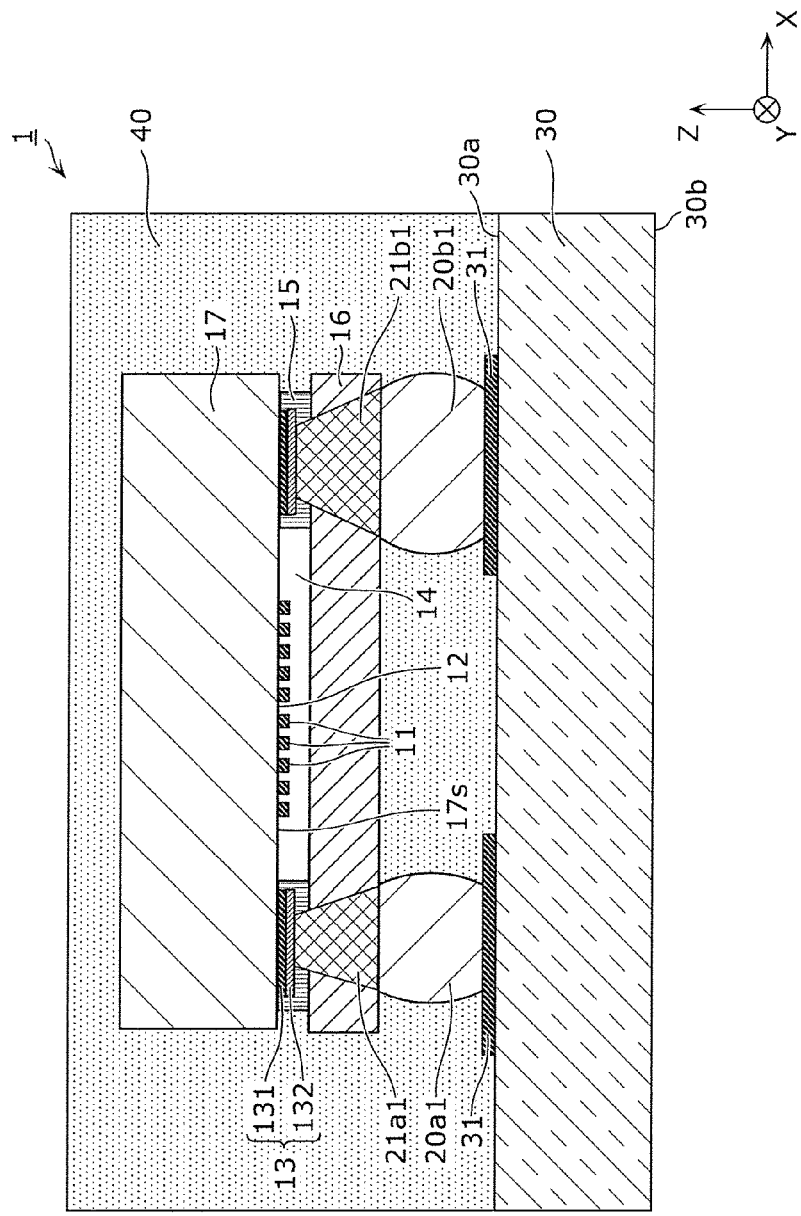
FIG. 2 is a sectional view of an elastic wave apparatus according to the first preferred embodiment of the present invention.

FIG. 2 is a sectional view of the elastic wave apparatus 1 according to the first preferred embodiment. The elastic wave apparatus 1 illustrated in FIG. 2 includes the elastic wave element 10, a mount board 30, and a resin member 40.

The mount board 30 is a substrate on which the elastic wave element 10 is mounted, for example, a printed circuit board or a ceramic substrate. The mount board 30 includes a first main surface 30a and a second main surface 30b. Land electrodes 31 and wirings (not illustrated) are disposed on at least the first main surface 30a. The land electrodes 31 and the wirings disposed on the first main surface 30a are electrically connected to internal wirings of the mount board 30 or an external connection electrode and the external wirings (not illustrated) provided on the second main surface 30b with, for example, via conductors (not illustrated) interposed therebetween. Thus, the external connection electrode and the external wirings disposed on the second main surface 30b are electrically connectable to external circuit components.

The elastic wave element 10 is flip-chip mounted (flip-chip bonded) on the land electrodes 31 disposed on the first main surface 30a of the mount board 30 with the bumps 20 interposed therebetween.

The resin member 40 is a sealing member that is in contact with the main surface 30a of the mount board 30 and covers the elastic wave element 10. In other words, the elastic wave element 10 is in close contact with the resin member 40 and covered with the resin member 40.

The resin member 40 improves the reliability in airtightness, heat resistance, moisture tightness, and insulating properties of the elastic wave element 10. The resin member 40 is preferably made of, for example, resin such as an epoxy resin. The resin member 40 may include a thermosetting epoxy resin including an inorganic filler such as $SiO_2$, for example.

Here, the resin member 40 is filled in the space between the cover layer 16 and the mount board 30 and between the multiple bumps 20, but is not disposed in the hollow space 14.

Subsequently, a layout of the joint terminals in the elastic wave element 10 is described.

FIG. 3 is a plan view of the surface of the cover layer 16 of the elastic wave element 10 according to the first preferred embodiment. More specifically, FIG. 3 illustrates the layout of the UBM portions 21 on the surface of the cover layer 16 facing the mount board 30, when viewed in the negative Z axis direction. The sectional views in FIG. 1 and FIG. 2 are taken along line I-I in FIG. 3.

The piezoelectric substrate 17 is preferably rectangular or substantially rectangular when the surface 17s is viewed in a plan view. As illustrated in FIG. 3, the cover layer 16 is preferably rectangular or substantially rectangular so as to correspond to the shape of the piezoelectric substrate 17. UBM portions 21a1, 21a2, 21a3, 21a4, 21b1, 21b3, 21b4, and 21b5 corresponding to the eight joint terminals are provided on the cover layer 16 of the elastic wave element 10 according to the first preferred embodiment.

In the layout of the UBM portions 21 in the elastic wave element 10, the basic pitch of the UBM portions 21 in the upper row (Y axis direction) is a distance Lb2 between the UBM portions 21b3, 21b4, and 21b5. On the other hand, the basic pitch of the UBM portions 21 in the lower row (Y axis direction) is a distance La1 between the UBM portions 21a1, 21a2, 21a3, and 21a4. Based on such regularity, the distance Lb1 between the UBM portions 21b1 and 21b3 is longer than the distance Lb2, so that the UBM portions 21 are arrayed in a bilaterally asymmetrical layout. The area $A_{21b1}$ of the second end surface 21s of the UBM portion 21b1 and the area $A_{21b3}$ of the second end surface 21s of the UBM portion 21b3 are greater than the areas ($A_{21a1}$, $A_{21a2}$, $A_{21a3}$, $A_{21a4}$, $A_{21b4}$, and $A_{21b5}$) of the second end surfaces 21s of the other UBM portions.

Specifically, the elastic wave element 10 includes large joint areas to join the UBM portion 21b1 and the bump 20b1 and to join the UBM portion 21b3 and a bump 20b3, the joint areas being spaced a distance (Lb1), which is greater than the regular distances (La1 and Lb2) between other UBM portions 21 determined to retain the symmetry of the layout of the UBM portions 21 in the cover layer 16.

Here, the principles taken into consideration to determine which of the multiple UBM portions 21 has/have its/their second end surface/surfaces 21s enlarged in area are described.

First, when the surface 17s of the piezoelectric substrate 17 is viewed in a plan, the shortest one of the distances between a specified joint terminal (UBM portion 21) and multiple joint terminals (UBM portions 21) around the specified joint terminal is determined as an inter-bump distance of the specified joint terminal.

For example, in the case of FIG. 3, the shortest one of the distances between the UBM portion 21b5 and the UBM portions 21b4, 21a3, and 21a4 around the UBM portion 21b5 is the distance Lb2 between the UBM portion 21b5 and the UBM portion 21b4. Specifically, the inter-bump distance of the UBM portion 21b5 is Lb2. In addition, the shortest one of the distances between the UBM portion 21b1 and the UBM portions 21b3, 21a1, and 21a2 around the UBM portion 21b1 is the distance Lb1 between the UBM portion 21b1 and the UBM portion 21b3. Specifically, the inter-bump distance of the UBM portion 21b1 is Lb1. In addition, the shortest one of the distances between the UBM portion 21a1 and the UBM portions 21b1, 21b3, and 21a2 around the UBM portion 21a1 is the distance La1 between the UBM portion 21a1 and the UBM portion 21a2. Specifically, the inter-bump distance of the UBM portion 21a1 is La1. In this manner, the inter-bump distance of each joint terminal (each UBM portion 21) is determined.

Subsequently, a first joint terminal having an inter-bump distance longer than a shortest one of the inter-bump distances determined for the respective joint terminals (UBM portions 21) and the longest of the inter-bump distances.

For example, in FIG. 3, the shortest inter-bump distance is the inter-bump distance Lb2 of the UBM portions 21b3, 21b4, and 21b5. In this case, the joint terminal having an inter-bump distance longer than a shortest inter-bump distance Lb2 and the longest of the inter-bump distances is the UBM portion 21b1, which has the inter-bump distance Lb1. Specifically, the joint terminal defined by the UBM portion 21b1 is determined to be the first joint terminal.

Subsequently, a second joint terminal that is spaced the longest inter-bump distance apart from the first joint terminal is determined.

For example, in FIG. 3, the second joint terminal that is spaced the longest inter-bump distance Lb1 apart from the UBM portion 21b1, which is the first joint terminal, is the joint terminal defined by the UBM portion 21b3.

Finally, the areas of the second end surfaces 21s of the UBM portion 21b1 and UBM portion 21b3, defining and functioning as the first and second joint terminals, are larger than the areas of the second end surfaces 21s of the UBM portions 21a1 to 21a4 and 21b4 to 21b5, defining the other joint terminals.

Figure 4A:
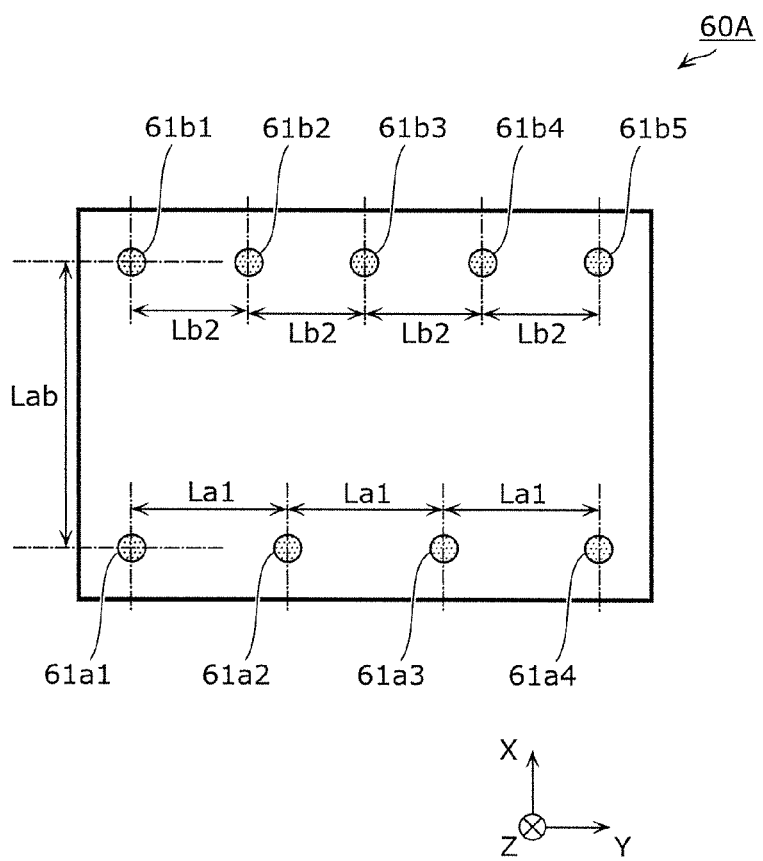
FIG. 4A is a plan view of a cover layer surface of an existing elastic wave element.

FIG. 4A is a plan view of a cover layer surface of an existing elastic wave element 60A. As illustrated in FIG. 4A, the basic pitch of UBM portions 61 in the upper row (Y axis direction) is the distance Lb2. The basic pitch of the UBM portions 61 in the lower row (Y axis direction) is the distance La1. The UBM portions 61 are regularly arrayed without exception, in a bilaterally symmetrical layout. When the existing elastic wave element 60A is mounted on a mount board, stress imposed on the joint terminals due to the temperature change during mounting of the element on the mount board and use of the element is equalized. The elastic wave device having this structure has mechanical reliability. However, as in the case of the elastic wave element 60A, reduction of the pitch of the bumps, while retaining the symmetry of the bump layout, to satisfy the demand for size reduction of the elastic wave apparatus hinders resin introduction into the space between the elastic wave element 60A and the mount board, and degrades the reliability in airtightness, heat resistance, moisture tightness, and insulating properties of the elastic wave element 60A.

Figure 4B:
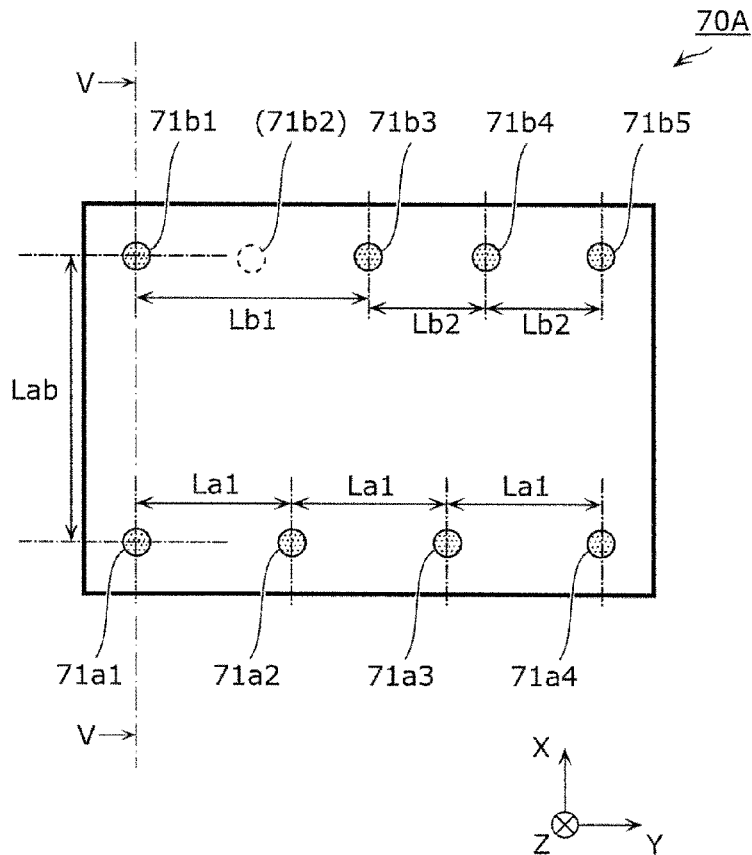
FIG. 4B is a plan view of a cover layer surface of an elastic wave element according to a first comparative example.

To address the reliability degradation, the layout of the UBM portions illustrated in FIG. 4B is conceivable.

Figure 5:
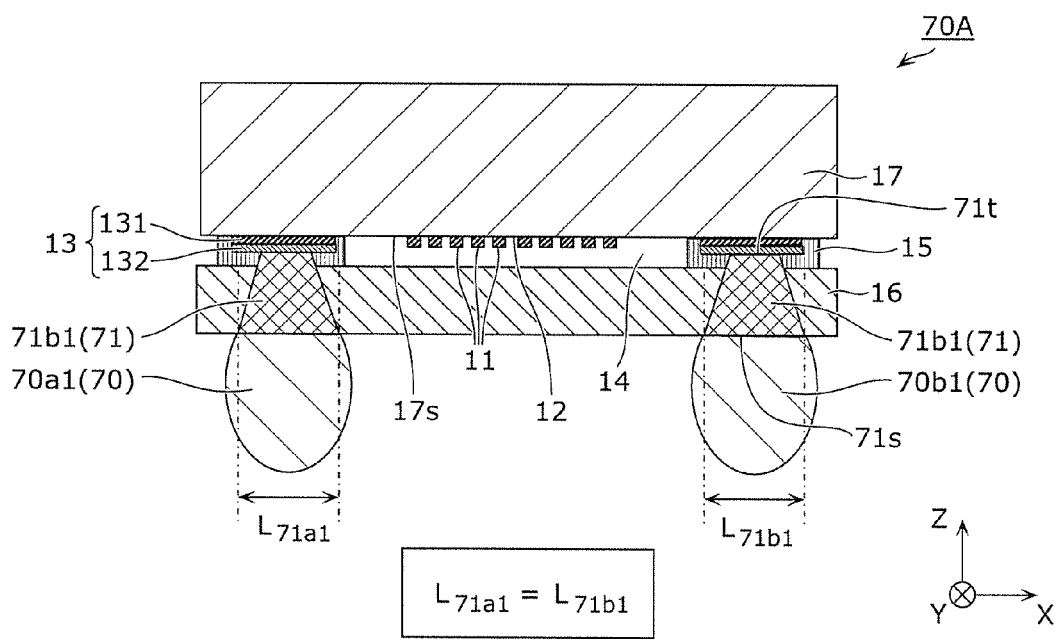
FIG. 5 is a sectional view of the elastic wave element according to the first comparative example.

FIG. 4B is a plan view of a cover layer surface of an elastic wave element 70A according to a first comparative example. FIG. 5 is a sectional view of the elastic wave element 70A according to the first comparative example. The sectional view in FIG. 5 is taken along V-V in FIG. 4B. As illustrated in FIG. 4B, the basic pitch of UBM portions 71 in the upper row (Y axis direction) and the basic pitch of the UBM portions 71 in the lower row (Y axis direction) remain constant to effectively disperse the stress on the joint terminals. Meanwhile, an UBM portion 71b2 that does not affect the electric characteristics is excluded to expand the distance between UBM portions 71b1 and 71b3, and to thus improve resin introduction into the space between the elastic wave element 70A and the mount board. This structure allows resin to be introduced into the space between the cover layer 16 and the mount board 30 through the space between the UBM portions 71b1 and 71b3. However, as in the case of the elastic wave element 70A, a reduction of the number of joint terminals (UBM portions 71) and an asymmetrical layout of the joint terminals produces uneven stress on the joint terminals. The areas of second end surfaces 71s of all of the UBM portions 71 are equal (in FIG. 5, length $L_{71a1}$=length $L_{71b1}$). In this layout, particularly, the stress on the joint terminal defined by the UBM portion 71b1 is greater than the stress on the other joint terminals. Thus, cracks are more likely to occur near the second end surface 21s of the joint terminal defined by the UBM portion 71b1.

On the other hand, in the structure of the elastic wave element 10 according to the present preferred embodiment, as illustrated in FIG. 3, the inter-bump distance Lb1 between the first joint terminal (UBM portion 21b1) and the second joint terminal (UBM portion 21b3) is longer than the other inter-bump distances to facilitate the resin introduction. In addition, the areas of the second end surfaces 21s of the first joint terminal (UBM portion 21b1) and the second joint terminal (UBM portion 21b3) are greater than the areas of the second end surfaces of the other joint terminals. This structure reduces the stress on the first joint terminal (UBM portion 21b1) and the second joint terminal (UBM portion 21b3), and thus reduces the unevenness of stress on the joint terminals. This structure thus prevents cracks from occurring near the second end surfaces of the first joint terminal (UBM portion 21b1) and the second joint terminal (UBM portion 21b3). Specifically, this structure facilitates resin introduction during sealing with resin and improves the mechanical reliability of the joint terminals.

Figure 6:
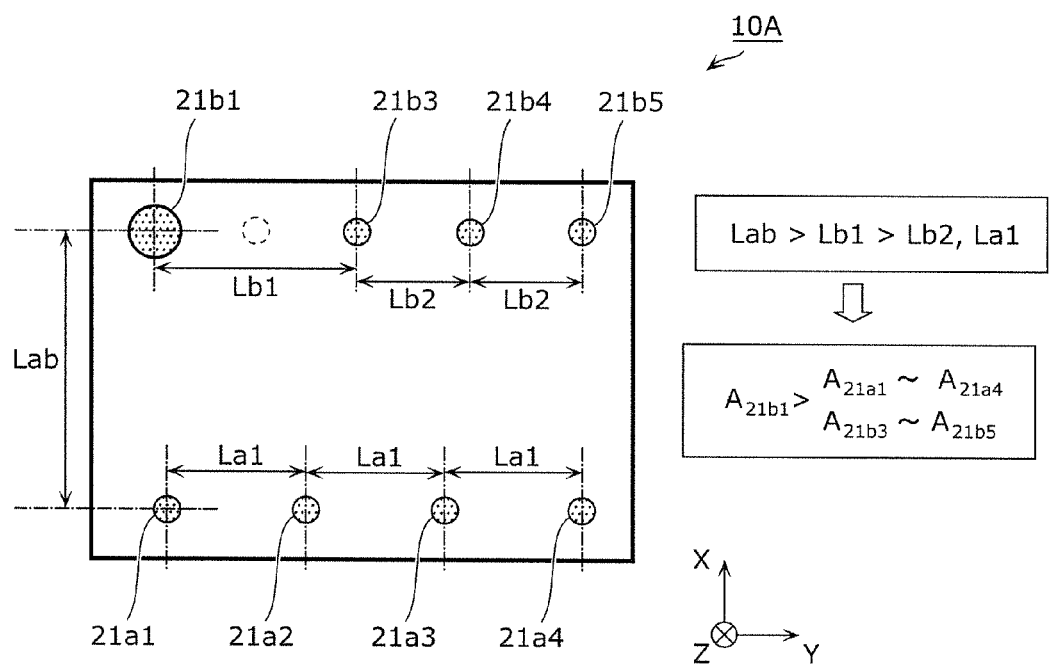
FIG. 6 is a plan view of a cover layer surface of an elastic wave element according to a first modification of the first preferred embodiment of the present invention.

FIG. 6 is a plan view of the surface of the cover layer 16 of an elastic wave element 10A according to a first modification of the first preferred embodiment. Instead of enlarging the areas of the second end surfaces 21s of both of the first joint terminal (UBM portion 21b1) and the second joint terminal (UBM portion 21b3), the area of the second end surface 21s of either one of the first and second joint terminals may be enlarged further than the areas of the second end surfaces 21s of the UBM portions 21a1 to 21a4 and 21b4 to 21b5 defining the other joint terminals, as illustrated in FIG. 6.

Enlarging the areas of the second end surfaces 21s of the joint terminals (UBM portions 21) reduces the gap between the joint terminals, and restricts the area of the vibrator 12 disposed between the joint terminals. With this point taken into consideration, enlarging the area of the second end surface 21s of either one of the first and second joint terminals further reduces the restriction on the layout of the vibrator 12 disposed on the piezoelectric substrate 17 while achieving facilitation of resin introduction during sealing with resin and preventing cracks from occurring in the joint terminals, as compared to enlarging the areas of the second end surfaces 21s of both of the first and second joint terminals.

In addition, as in the case of the elastic wave element 10A according to the first modification, the area of the second end surface 21s of either one of the first and second joint terminals located closer to one of the four corners of the piezoelectric substrate 17 may be enlarged further than the areas of the second end surfaces 21s of the other joint terminals. In the present modification, either one of the first and second joint terminals located closer to one of the four corners of the piezoelectric substrate 17 is the first joint terminal defined by the UBM portion 21b1.

In the structure in which the number of joint terminals (UBM portions) is reduced and the joint terminals are arrayed in an asymmetrical layout, either one of the first and second joint terminals located closer to one of the four corners of the piezoelectric substrate 17 is more likely to have cracks around its second end surface. With this point taken into consideration, the area of the second end surface 21s of either one of the first and second joint terminals located closer to one of the four corners of the piezoelectric substrate 17 is enlarged to reduce the restriction on the layout of the vibrator 12 and wirings disposed on the piezoelectric substrate 17, while achieving facilitation of resin introduction during sealing with resin and preventing cracks in the joint terminals.

Figure 7:
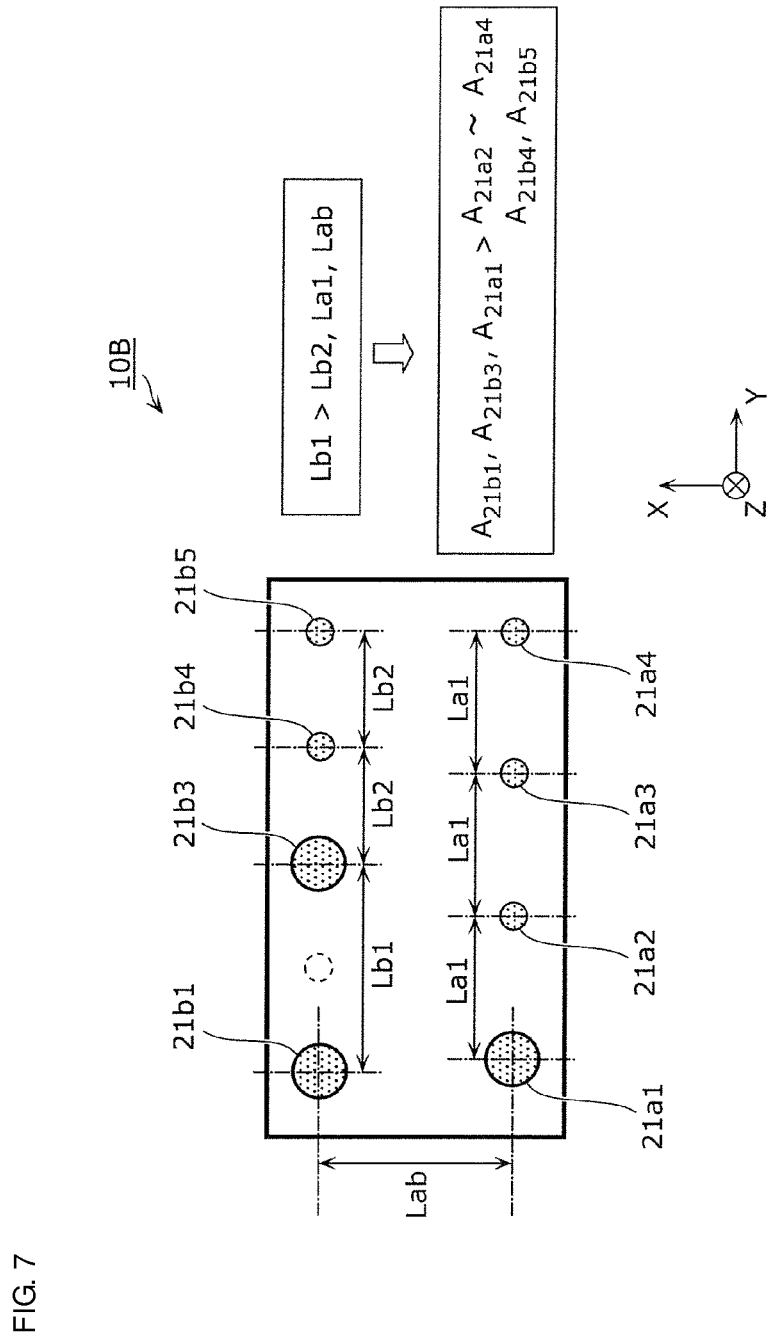
FIG. 7 is a plan view of a cover layer surface of an elastic wave element according to a second modification of the first preferred embodiment of the present invention.

FIG. 7 is a plan view of the surface of the cover layer 16 of an elastic wave element 10B according to a second modification of the first preferred embodiment. The elastic wave element 10B according to the present modification has a layout in which the distance between UBM portions in different rows is shorter than the distance between the UBM portions in the same row, as compared to the elastic wave element 10 according to the first preferred embodiment. In the elastic wave element 10B according to the present modification, different components are mainly described and components that are the same or substantially the same as those of the elastic wave element 10 according to the first preferred embodiment are not described.

In the layout of the UBM portions 21 in the elastic wave element 10B, the basic pitch of the UBM portions 21 in the upper row (Y axis direction) is the distance Lb2 between the UBM portions 21b3, 21b4, and 21b5. On the other hand, the basic pitch of the UBM portions 21 in the lower row (Y axis direction) is the distance La1 between the UBM portions 21a1, 21a2, 21a3, and 21a4. On the basis of such regularity, the distance Lb1 between the UBM portions 21b1 and 21b3 is longer than the distance Lb2, so that the UBM portions 21 are arrayed in a bilaterally asymmetrical layout. The area $A_{21b1}$ of the second end surface 21s of the UBM portion 21b1, the area $A_{21b3}$ of the second end surface 21s of the UBM portion 21b3, and the area $A_{21a1}$ of the second end surface 21s of the UBM portion 21a1 are greater than the areas ($A_{21a2}$, $A_{21a3}$, $A_{21a4}$, $A_{21b4}$, $A_{21b5}$) of the second end surfaces 21s of the other UBM portions.

Specifically, joint areas between the UBM portion 21b1 and the bump 20b1, between the UBM portion 21b3 and the bump 20b3, and between the UBM portion 21a1 and the bump 20a1 are enlarged.

Here, the principles taken into consideration to determine which of the multiple UBM portions 21 has/have its/their second end surface/surfaces 21s enlarged in area are described.

First, when the surface 17s of the piezoelectric substrate 17 is viewed in a plan, the shortest one of the distances between a specified joint terminal (UBM portion 21) and multiple joint terminals (UBM portions 21) around the specified joint terminal is determined as an inter-bump distance of the specified joint terminal.

For example, in the case of FIG. 7, the shortest one of the distances between the UBM portion 21b5 and the UBM portions 21b4, 21a3, and 21a4 around the UBM portion 21b5 is the distance Lb2 between the UBM portion 21b5 and the UBM portion 21b4. Specifically, the inter-bump distance of the UBM portion 21b5 is Lb2. In addition, the shortest one of the distances between the UBM portion 21b1 and the UBM portions 21b3, 21a1, and 21a2 around the UBM portion 21b1 is the distance Lab between the UBM portion 21b1 and the UBM portion 21a1. Specifically, the inter-bump distance of the UBM portion 21b1 is Lab. In addition, the shortest one of the distances between the UBM portion 21a1 and the UBM portions 21b1, 21b3, and 21a2 around the UBM portion 21a1 is the distance La1 between the UBM portion 21a1 and the UBM portion 21a2. Specifically, the inter-bump distance of the UBM portion 21a1 is La1. In this manner, the inter-bump distance of each joint terminal (each UBM portion 21) is determined.

Subsequently, a first joint terminal having an inter-bump distance longer than a shortest one of the inter-bump distances determined for the respective joint terminals (UBM portions 21) and the longest of the inter-bump distances is determined.

For example, in FIG. 7, the shortest inter-bump distance is the inter-bump distance Lb2 of the UBM portions 21b3, 21b4, and 21b5. In this case, the joint terminal has an inter-bump distance longer than the shortest inter-bump distance Lb2 and the longest of the inter-bump distances is the UBM portion 21b1, which has the inter-bump distance Lab. Specifically, the joint terminal defined by the UBM portion 21b1 is determined to be the first joint terminal.

Subsequently, a second joint terminal that is spaced the longest inter-bump distance apart from the first joint terminal is determined.

For example, in FIG. 7, the second joint terminal that is spaced the longest inter-bump distance Lab apart from the UBM portion 21b1, which is the first joint terminal, is the joint terminal defined by the UBM portion 21a1.

Thereafter, the areas of the second end surfaces 21s of the UBM portion 21b1 and the UBM portion 21a1 defining the first and second joint terminals are enlarged further than the areas of the second end surfaces 21s of the UBM portions 21a2 to 21a4 and 21b4 to 21b5 defining the other joint terminals.

Finally, the area of the second end surface 21s of the third joint terminal located second closest to the first joint terminal (UBM portion 21b1) after the second joint terminal (UBM portion 21a1) is enlarged further than the areas of the second end surfaces 21s of the UBM portions 21a2 to 21a4 and 21b4 to 21b5 of the other joint terminals.

For example, in FIG. 7, the third joint terminal located second closest to the first joint terminal (UBM portion 21b1) after the second joint terminal (UBM portion 21a1) is the joint terminal defined by the UBM portion 21b3.

This structure reduces, besides the stress imposed on the first and second joint terminals in the direction (X-axis direction) connecting the first and second joint terminals, the stress imposed on the first and second joint terminals in a direction (Y axis direction) different from the above direction. Thus, this structure further prevents cracks from occurring near the second end surfaces 21s of the first and second joint terminals.

In the present modification, the area of the second end surface 21s of either one of the first joint terminal (UBM portion 21b1) and the second joint terminal (UBM portion 21a1) and the area of the second end surface 21s of the third joint terminal (UBM portion 21b3) may be enlarged further than the areas of the second end surfaces 21s of the other joint terminals.

Second Preferred Embodiment

A second preferred embodiment of the present invention includes a layout in which multiple second joint terminals are arrayed, each spaced the longest inter-bump distance apart from the first joint terminal. Components of an elastic wave element 10C according to the present preferred embodiment that are the same or substantially the same as those of the elastic wave element 10 according to the first preferred embodiment are not described, and different components are mainly described.

Figure 8:
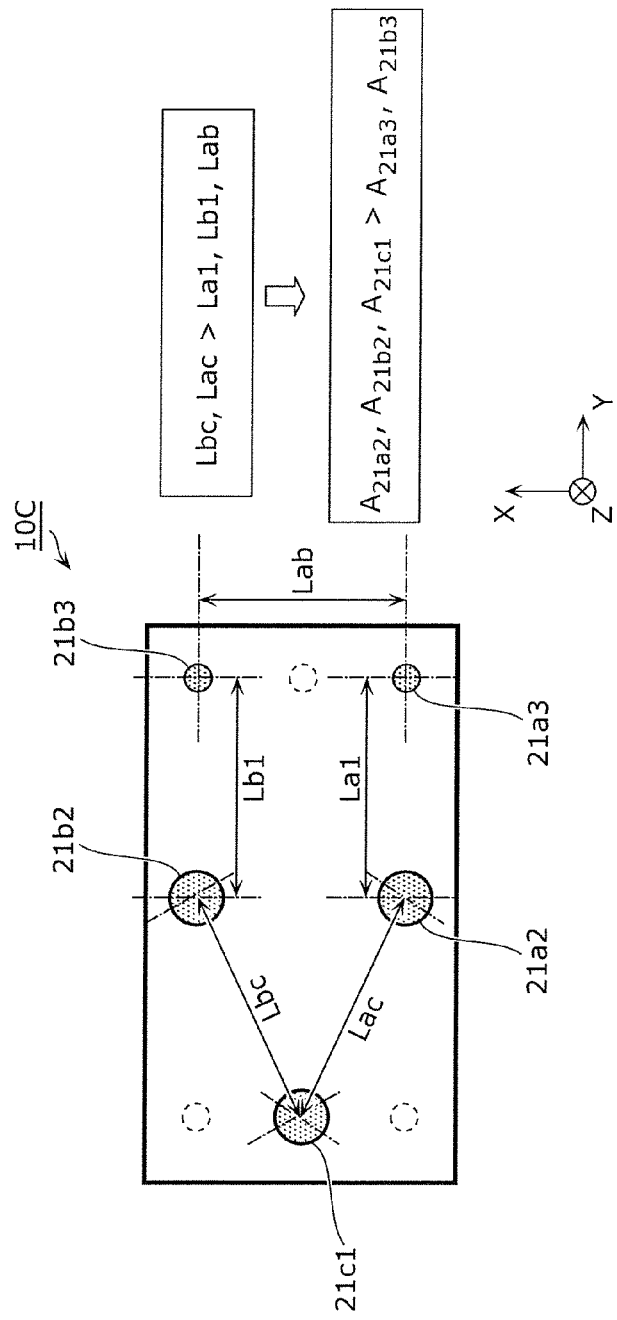
FIG. 8 is a plan view of a cover layer surface of an elastic wave element according to a second preferred embodiment of the present invention.

FIG. 8 is a plan view of the surface of the cover layer 16 of the elastic wave element 10C according to the second preferred embodiment. More specifically, FIG. 8 illustrates the layout of the UBM portions 21 on the surface of the cover layer 16 facing the mount board 30, when viewed in the negative Z-axis direction.

As illustrated in FIG. 8, UBM portions 21a2, 21a3, 21b2, 21b3, and 21c1 corresponding to five joint terminals are arrayed on the cover layer 16 of the elastic wave element 10C according to the second preferred embodiment.

In the layout of the UBM portions 21 in the elastic wave element 10C, the basic pitch of the UBM portions 21 in the upper row (Y axis direction) is the distance Lb1 between the UBM portions 21b2 and 21b3. On the other hand, the basic pitch of the UBM portions 21 in the lower row (Y axis direction) is the distance La1 between the UBM portions 21a2 and 21a3. Based on such regularity, the distances Lbc and Lac (=Lbc) between a UBM portion 21c1 and the UBM portions 21b2 and 21a2 located closest to the UBM portion 21c1 is longer than the distances La1 and Lb2. Thus, the UBM portions 21 are arrayed in a bilaterally asymmetrical layout. The area $A_{21a2}$ of the second end surface 21s of the UBM portion 21a2, the area $A_{21c2}$ of the second end surface 21s of the UBM portion 21b2, and the area $A_{21c1}$ of the second end surface 21s of the UBM portion 21c1 are greater than the areas ($A_{21b3}$, $A_{21a3}$) of the second end surfaces 21s of the other UBM portions.

Specifically, the elastic wave element 10C provides large joint areas to join the UBM portion 21c1 and a bump 20c1, to join the UBM portion 21b2 and a bump 20b2, and to join the UBM portion 21a2 and a bump 20a2, the joint areas being spaced apart the distances (Lac and Lbc), which are greater than the regular distances (La1 and Lb1) between other UBM portions 21 determined to maintain the symmetry of the layout of the UBM portions 21 in the cover layer 16.

Here, the principles taken into consideration to determine which of the multiple UBM portions 21 has/have its/their second end surface/surfaces 21s enlarged in area are described.

First, when the surface 17s of the piezoelectric substrate 17 is viewed in a plan view, the shortest one of the distances between a specified joint terminal (UBM portion 21) and multiple joint terminals (UBM portions 21) around the specified joint terminal is determined as an inter-bump distance of the specified joint terminal.

For example, in the case of FIG. 8, the shortest one of the distances between the UBM portion 21b3 and the UBM portions 21b2, 21a2, and 21a3 around the UBM portion 21b3 is the distance Lab between the UBM portion 21b3 and the UBM portion 21a3. Specifically, the inter-bump distance of the UBM portion 21b3 is Lab. In addition, the shortest one of the distances between the UBM portion 21b2 and the UBM portions 21c1, 21a2, and 21b3 around the UBM portion 21b2 is the distance Lab between the UBM portion 21b2 and the UBM portion 21a2. Specifically, the inter-bump distance of the UBM portion 21b2 is Lab. In addition, the shortest one of the distances between the UBM portion 21c1 and the UBM portions 21b2 and 21a2 around the UBM portion 21c1 is the distances Lbc and Lac between the UBM portion 21c1 and the UBM portions 21b2 and 21a2. Specifically, the inter-bump distance of the UBM portion 21c1 is Lbc (=Lac). In this manner, the inter-bump distance of each joint terminal (each UBM portion 21) is determined.

Subsequently, a first joint terminal having an inter-bump distance longer than a shortest one of the inter-bump distances determined for the respective joint terminals (UBM portions 21) and the longest of the inter-bump distances is determined.

For example, in FIG. 8, the shortest inter-bump distance is the inter-bump distance Lab of the UBM portions 21b3 and 21a3. In this case, the joint terminal having an inter-bump distance longer than the shortest inter-bump distance Lab and the longest of inter-bump distances is the UBM portion 21c1, which has the inter-bump distance Lbc (=Lac). Specifically, the joint terminal defined by the UBM portion 21c1 is determined to be the first joint terminal.

Subsequently, a second joint terminal that is spaced the longest inter-bump distance apart from the first joint terminal is determined.

For example, in FIG. 8, the second joint terminals that are spaced the longest inter-bump distances Lbc and Lac apart from the UBM portion 21c1, which is the first joint terminal, are the joint terminals defined by the UBM portion 21b2 and the UBM portion 21a2.

Finally, the areas of the second end surfaces 21s of the UBM portions 21c1, 21b2, and 21a2 defining and functioning as the first and second joint terminals are enlarged further than the areas of the second end surfaces 21s of the UBM portions 21b3 and 21a3 defining and functioning as the other joint terminals.

Figure 9A:
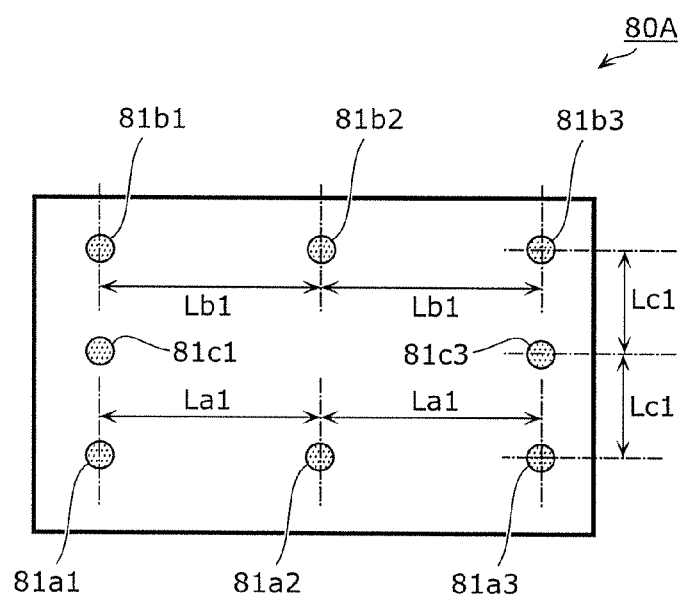
FIG. 9A is a plan view of a cover layer surface of an existing elastic wave element.
Figure 9A:
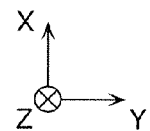

FIG. 9A is a plan view of a cover layer surface of an existing elastic wave element 80A. As illustrated in FIG. 9A, the basic pitch of UBM portions 81 in the upper row (Y axis direction) is the distance Lb1. On the other hand, the basic pitch of the UBM portions 81 in the lower row (Y axis direction) is the distance La1. The basic pitch between the UBM portions 81 in the center row (Y axis direction) and the UBM portions 81 in the other rows is the distance Lc1. The UBM portions 81 are regularly arrayed without exception, in a bilaterally symmetrical layout. When the existing elastic wave element 80A is mounted on a mount board, bump joint stress imposed on the joint terminals due to the temperature change during mounting of the element on the mount board and use of the element is equalized. The elastic wave apparatus having this structure thus has mechanical reliability. However, as in the case of the elastic wave element 80A, reduction of the pitch of the bumps, while retaining the symmetry of the bump layout, to satisfy the demand for size reduction of the elastic wave apparatus hinders resin introduction into the space between the elastic wave element 80A and the mount board, and degrades the reliability in airtightness, heat resistance, moisture tightness, and insulating properties of the elastic wave element 80A.

Figure 9B:
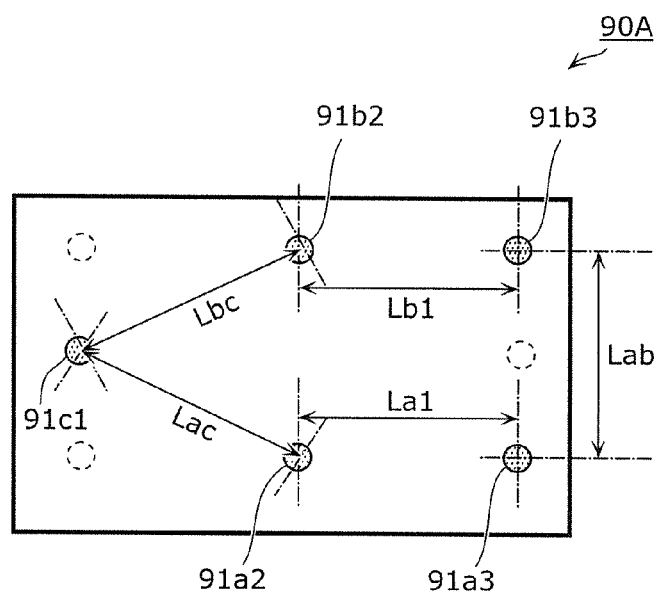
FIG. 9B is a plan view of a cover layer surface of an elastic wave element according to a second comparative example.

To address the reliability degradation, the layout of UBM portions 91 illustrated in FIG. 9B is conceivable.

FIG. 9B is a plan view of the cover layer surface of an elastic wave element 90A according to a second comparative example. As illustrated in FIG. 9B, the basic pitches of UBM portions 91 in the upper, center, and lower rows (Y axis direction) remain constant to effectively disperse the stress on the joint terminals. Meanwhile, UBM portions 91b1, 91a1, and 91c3 that do not affect the electric characteristics are not provided so as to expand the distance between UBM portions 91c1 and 91b2, the distance between UBM portions 91c1 and 91a2, and the distance between UBM portions 91b3 and 91a3 and to, thus, improve the resin introduction into the space between the elastic wave element 90A and the mount board. This structure facilitates resin introduction into the space surrounded by the UBM portions 91. However, as in the case of the elastic wave element 90A, a reduction of the number of joint terminals (UBM portions 91) and an asymmetrical layout of the joint terminals produce uneven stress on the joint terminals. The areas of second end surfaces 91s of all of the UBM portions 91 are equal. In this layout, particularly, the stress on the joint terminal defining the UBM portion 91c1 is greater than the stress on the other joint terminals. Thus, cracks are more likely to occur near the second end surface 91s of the joint terminal constituting the UBM portion 91c1.

On the other hand, in the structure of the elastic wave element 10C according to the present preferred embodiment, as illustrated in FIG. 8, the inter-bump distances Lbc and Lac between the first joint terminal (UBM portion 21c1) and the second joint terminals (UBM portions 21b2 and 21a2) are longer than the other inter-bump distances to facilitate the resin introduction. In addition, the areas of the second end surfaces 21s of the first joint terminal (UBM portion 21c1) and the second joint terminals (UBM portions 21b2 and 21a2) are greater than the areas of the second end surfaces of the other joint terminals. This structure reduces the stress on the first joint terminal (UBM portion 21c1) and the second joint terminals (UBM portions 21b2 and 21a2), and thus reduces the unevenness of stress on the joint terminals. This structure thus prevents cracks from occurring near the second end surfaces of the first joint terminal (UBM portion 21c1) and the second joint terminals (UBM portions 21b2 and 21a2). Specifically, this structure facilitates resin introduction during sealing with resin and improves the mechanical reliability of the joint terminals.

Elastic wave elements and elastic wave apparatuses according to preferred embodiments of the present invention are described in the preferred embodiments and modifications described above. The elastic wave elements and the elastic wave apparatuses of the present invention are not limited to those in the preferred embodiments and the modifications described above. The present invention also includes other preferred embodiments embodied by combining any of the components in the preferred embodiments and the modifications described above, other modifications provided by modifying the preferred embodiments and the modifications described above in various manners conceivable by persons having ordinary skill in the art within the scope not departing from the gist of the present invention, and various different devices including the elastic wave elements and/or the elastic wave apparatuses disclosed herein.

The application of the elastic wave element according to each of the first and second preferred embodiments is not limited to a SAW filter. The elastic wave element may be applicable to an elastic wave filter using a boundary acoustic wave or a bulk acoustic wave (BAW).

In the first and second preferred embodiments, the size of each bump 20 is changed in correspondence with the area of the second end surface 21s of the corresponding UBM portion 21. However, the size of the bumps 20 may be uniform regardless of the areas of the second end surfaces 21s of the UBM portions 21. For example, in FIG. 1, the area (width L21b1) of the second end surface 21s of the UBM portion 21b1 is greater than the area (width L21a1) of the second end surface 21s of the UBM portion 21a1. Correspondingly, the width of the bump 20b1 is greater than the width of the bump 20a1. In contrast, the bumps 20b1 and 20a1 may have the same or substantially the same size (width), although the area of the second end surface 21s of the UBM portion 21b1 is greater than the area of the second end surface 21s of the UBM portion 21a1. Specifically, the characteristics of preferred embodiments of the present invention depend, not on changing the size of the bumps, but on reducing the unevenness of stress on the joint terminals by changing the joint area between each bump 20 and the corresponding UBM portion 21 in accordance with the layout of the joint terminals.

Preferred embodiments of the present invention are widely applicable to telecommunication devices, such as, for example, cellular phones, as small-size and low-profile elastic wave apparatuses that have high resistance against thermal shock.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave element, comprising:
  a substrate including a first main surface and a second main surface, which face away from each other;
  an elastic wave exciting portion disposed on the substrate to excite elastic waves;
  an electrode pad disposed on the first main surface and connected to the elastic wave exciting portion;
  an intermediate electrode including a first end surface and a second end surface, which face away from each other, the first end surface being joined to the electrode pad; and
  a bump joined to the second end surface of the intermediate electrode; wherein
  three or more joint terminals are disposed on the first main surface, each of the joint terminals being defined by a joint among the electrode pad, the intermediate electrode, and the bump;
  when the first main surface is viewed in a plan view, a shortest one of distances between a specified one of the joint terminals and other joint terminals around the specified joint terminal is determined as an inter-bump distance of the specified joint terminal; and
  the second end surface of at least one of a first joint terminal and a second joint terminal among the three or more joint terminals has an area greater than areas of the second end surfaces of a remaining joint terminal or remaining joint terminals among the three or more joint terminals, the inter-bump distance of the first joint terminal being longer than a shortest one of the inter-bump distances determined for the respective joint terminals and being a longest of the inter-bump distances, the second joint terminal being spaced the longest inter-bump distance apart from the first joint terminal.

2. The elastic wave element according to claim 1, wherein the second end surface of a third joint terminal among the three or more joint terminals located second closest to the first joint terminal after the second joint terminal has an area greater than areas of the second end surfaces of a remaining joint terminal or remaining joint terminals among the three or more joint terminals.

3. The elastic wave element according to claim 1, wherein, the area of the second end surface of either one of the first and second joint terminals is greater than the areas of the second end surfaces of a remaining joint terminal or the remaining joint terminals among the three or more joint terminals.

4. The elastic wave element according to claim 1, wherein, when the first main surface is seen in plan view, the substrate is rectangular or substantially rectangular, and the area of the second end surface of either one of the first and second joint terminals located closer to any of four corners of the substrate is greater than the areas of the second end surfaces of a remaining joint terminal or remaining joint terminals among the three or more joint terminals.

5. The elastic wave element according to claim 1, wherein a plurality of at least one of the first and second joint terminals are provided.

6. The elastic wave element according to claim 1, wherein the substrate is made of a piezoelectric material.

7. The elastic wave element according to claim 6, wherein the piezoelectric material is a $LiNbO_3$ single crystal or a $LiTaO_3$ single crystal.

8. The elastic wave element according to claim 1, wherein the elastic wave exciting portion includes an IDT electrode.

9. The elastic wave element according to claim 8, wherein the IDT electrode is a comb-shaped electrode including:
  Cu, Al, Pt;
  a multilayer body made of Cu, Al, and Pt; or
  an alloy of any of Cu, Al, and Pt.

10. An elastic wave apparatus, comprising:
  the elastic wave element according to claim 1;
  a mount board to which the bump is joined, the mount board being disposed opposite the elastic wave element; and
  a resin member disposed in contact with the mount board so as to cover the elastic wave element; wherein
  the substrate is a piezoelectric substrate;
  the elastic wave exciting portion includes an IDT electrode disposed on the first main surface;
  the elastic wave element further includes:
    a support layer provided on the first main surface around an area in which the IDT electrode is disposed, the support layer having a height from the first main surface greater than a height of the IDT electrode; and
    a cover layer provided such that the support layer is disposed between the cover layer and the first main surface and covering the IDT electrode;

the intermediate electrode is disposed in contact with the support layer so as to extend through the cover layer;

the substrate, the support layer, and the cover layer define an interior space in which the IDT electrode is disposed; and the resin member is disposed in a space between the cover layer and the mount board and between a plurality of the bumps, and is not disposed in the interior space.

11. The elastic wave apparatus according to claim 10, wherein the second end surface of a third joint terminal among the three or more joint terminals located second closest to the first joint terminal after the second joint terminal, has an area greater than areas of the second end surfaces of a remaining joint terminal or remaining joint terminals among the three or more joint terminals.

12. The elastic wave apparatus according to claim 10, wherein the area of the second end surface of either one of the first and second joint terminals is greater than the areas of the second end surfaces of a remaining joint terminal or remaining joint terminals among the three or more joint terminals.

13. The elastic wave apparatus according to claim 10, wherein, when the first main surface is seen in plan view, the substrate is rectangular or substantially rectangular, and the area of the second end surface of either one of the first and second joint terminals located closer to any of four corners of the substrate is greater than the areas of the second end surfaces of a remaining joint terminal or remaining joint terminals among the three or more joint terminals.

14. The elastic wave apparatus according to claim 10, wherein a plurality of at least one of the first and second joint terminals are provided.

15. The elastic wave apparatus according to claim 10, wherein the piezoelectric substrate is made of a $LiNbO_3$ single crystal or a $LiTaO_3$ single crystal.

16. The elastic wave apparatus according to claim 10, wherein the IDT electrode is a comb-shaped electrode mainly made of Cu, Al, Pt, a multilayer body made of Cu, Al, and Pt, or an alloy of any of Cu, Al, and Pt.

17. The elastic wave apparatus according to claim 10, wherein the support layer is made of a material including at least one of polyimide, epoxy, benzocyclobutene (BCB), polybenzoxazole (PBO), metal, and a silicon oxide.

18. The elastic wave apparatus according to claim 10, wherein the cover layer is made of a material including at least one of epoxy, polyurethane, phenol, polyester, BCB, and PBO.

* * * * *